US006625767B1

(12) United States Patent
Ayrignac

(10) Patent No.: US 6,625,767 B1
(45) Date of Patent: Sep. 23, 2003

(54) METHOD AND DEVICE FOR COLLECTING OUTPUT LOGIC VALUES FROM A LOGIC UNIT IN AN ELECTRONIC CIRCUIT

(75) Inventor: Renaud Ayrignac, Grenoble (FR)

(73) Assignee: STMicroelectronics SA, Gentilly (FR)

( * ) Notice: Subject to any disclaimer, the term of this patent is extended or adjusted under 35 U.S.C. 154(b) by 0 days.

(21) Appl. No.: 09/558,935

(22) Filed: Apr. 26, 2000

(30) Foreign Application Priority Data

Apr. 30, 1999 (FR) .............................. 99 05550

(51) Int. Cl.[7] .............................. G01R 31/28; G06F 1/02
(52) U.S. Cl. ......................... 714/724; 708/254
(58) Field of Search ............................... 714/726, 727, 714/724; 708/254; 364/717

(56) References Cited

U.S. PATENT DOCUMENTS

| | | | | |
|---|---|---|---|---|
| 5,129,092 A | * | 7/1992 | Wilson .................. | 382/304 |
| 5,383,143 A | * | 1/1995 | Crouch et al. ............ | 708/254 |
| 5,519,714 A | | 5/1996 | Nakamura et al. ......... | 371/22.3 |
| 5,592,493 A | * | 1/1997 | Crouch et al. ............ | 324/73.1 |
| 5,838,693 A | * | 11/1998 | Morley .................. | 714/726 |
| 6,242,269 B1 | * | 6/2001 | Whetsel ................. | 438/11 |
| 6,271,701 B1 | * | 8/2001 | DiTommaso ............... | 326/93 |
| 6,327,685 B1 | * | 12/2001 | Koprowski et al. ........ | 365/201 |
| 6,370,664 B1 | * | 4/2002 | Bhawmik ................. | 714/726 |

FOREIGN PATENT DOCUMENTS

| EP | 0 708 408 | 10/1995 | ........... G06F/17/50 |
|---|---|---|---|

* cited by examiner

*Primary Examiner*—Albert Decady
*Assistant Examiner*—Anthony T. Whittington
(74) *Attorney, Agent, or Firm*—Lisa K. Jorgenson; Allen, Dyer, Doppelt, Milbrath & Gilchrist, P.A.

(57) ABSTRACT

A method and device for collecting logic values output from a logic unit having n inputs and p outputs included within an electronic circuit is provided by p test cells. These test cells are connected in parallel respectively to the p outputs of the logic unit such that the logic values of the outputs of the logic unit are loaded into the test cells in a normal mode, and are connected in series with each other to form a shift register for propagating logic values of the outputs of the logic unit to a collecting node in a test mode. In a first phase, the logic values of one out of two outputs of the logic unit are propagated to the shift register. Then, in a second phase, the logic values of the other outputs of the logic unit are propagated in the shift register. The logic values of the outputs of the logic unit are reloaded in the test cells between the first and second phase.

43 Claims, 2 Drawing Sheets

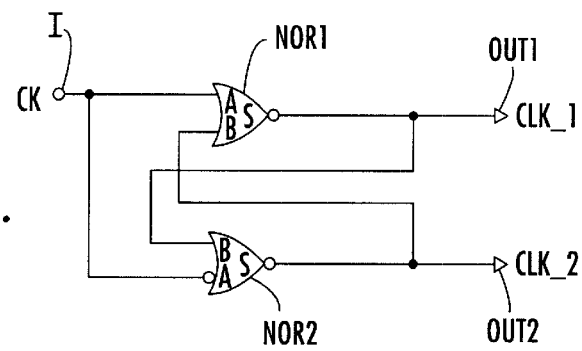
FIG.4.
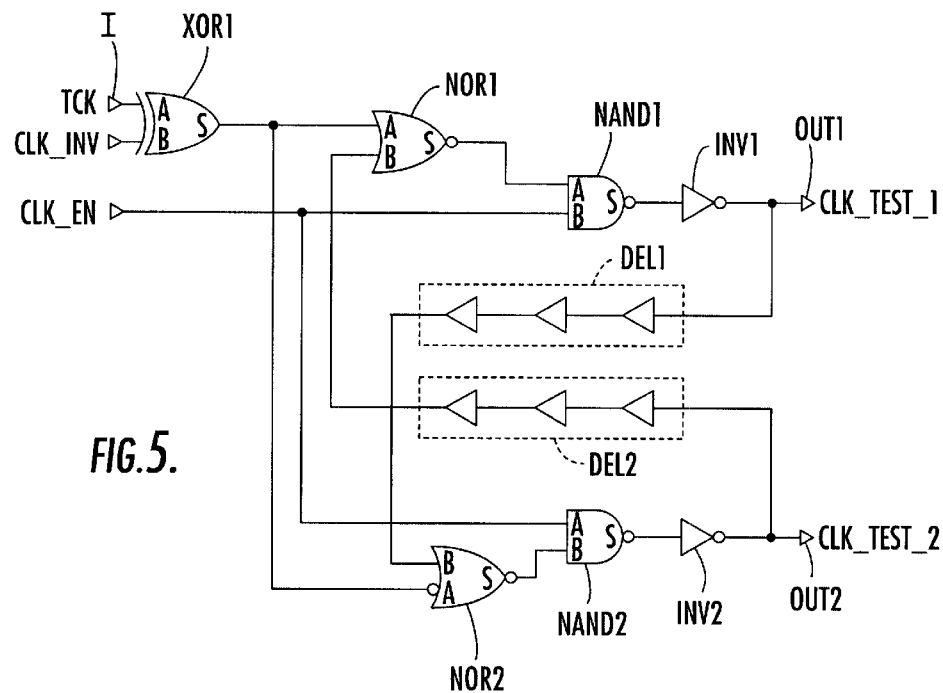
FIG.5.
FIG.6a. TCK 
FIG.6b. CLK_INV 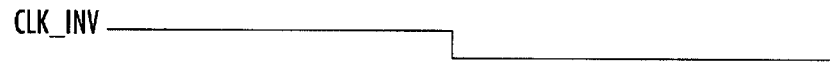
FIG.6c. CLK_EN 
FIG.6d. CLK_TEST_1 
FIG.6e. CLK_TEST_2 

METHOD AND DEVICE FOR COLLECTING OUTPUT LOGIC VALUES FROM A LOGIC UNIT IN AN ELECTRONIC CIRCUIT

FIELD OF THE INVENTION

The present invention relates to the field of electronic circuit testing, and, more particularly, to a method and device for collecting output logic values from a logic circuit in an electronic circuit.

BACKGROUND OF THE INVENTION

The term "logic unit" as used throughout the description encompasses a set of logic gates connected together to provide a given logic function in an electronic circuit. This is more specifically the case with a combinatory logic function. The invention can also apply to a logic unit which executes a sequential logic function. Moreover, the term "electronic circuit" is to be understood in its broadest sense. Electronic circuit encompasses all discrete (packaged) electronic components and any construction from such components mounted on a printed circuit to form a functional unit, any unitary component implanted on a semiconductor substrate (i.e., an on-chip device), and any construction from such components.

FIG. 1 is a circuit diagram of a prior art device for collecting output values from a logic unit. In the figure, a logic unit to be tested is symbolized by a substantially oval shape 10. It is included in an electronic circuit 5. The logic circuits of the electronic circuit 5, which operate upstream of the logic unit 10, are symbolized by a substantially oval shape 20. The logic unit 10 includes n inputs designated E1, . . . , En and p outputs designated S1, . . . , Sp.

The means for testing the logic unit 10 include a device for collecting output values of that unit, which includes p test cells designated CT'1, . . . , CT'p in accordance with the IEEE 1149.1b-1994 standard (known as the JTAG standard). These test cells are connected in the following manner. First, they are connected in parallel to the respective p outputs S1, . . . , Sp of the logic unit 10 such that in the electronic circuit's normal operating mode (normal mode), the output values of the logic unit 10 are loaded into the test cells. Second, the test cells are connected in series with one another to form a shift register for propagating output values to a node TDO for collecting these values in a specific operating mode of the device known as the test mode. The test cells then form an ordered chain along the propagation direction of the logic values in the shift register they form, i.e., from left to right as shown in the figure. By convention, the terms rank, first, last, following and preceding are used with reference to this ordered chain.

In the test mode, the thus-formed shift register serves to collect the output values of the logic unit 10 so that they can be analyzed by a test instrument. To this end, the electronic circuit includes a special output pin connected to node TDO for implementing the test mode in accordance with the boundary scan test mode. Other identical test cells (not shown) are similarly connected to inputs E1, . . . , En of the logic unit 10. They also form a shift register which, in a test mode, serves to input test vectors on these inputs from a special serial input TDI of the circuit (not shown).

Different types of test cells are known in the prior art. One which is particularly widespread and shown in FIG. 1 (CT'1 to CT'p) includes a D-type flip-flop responsive to a signal edge (transition from one logic state to the other), as indicated by the > symbol shown at the clock input CP of the cell. In practice, the electronic circuit already includes such flip-flops for sampling the outputs in the normal mode.

The JTAG standard causes these existing flip-flops to fulfill another function in the test mode, namely that of an element of a shift register for propagating the logic values from the outputs to the collecting node. In other words, a test cell is adapted from a flip-flop already present in the electronic circuit. In addition to the D and CP inputs and the Q output of the D-type flip-flop, a test cell includes an input TI and an input TE.

The Q output of a D-type flip-flop of a given cell is connected to an input TI (known as the serial input in the JTAG standard) of the following cell, and to the input of one of the logic circuits of the electronic circuits 5 which are operative upstream of the logic unit 10. In FIG. 1, the logic circuitry is shown symbolically by an oval 30. Each cell is connected by an input D (known as the parallel input in the JTAG standard) to one of the outputs S1, . . . , Sp of unit 10.

The clock input CP of each cell receives a clock signal CLOCK. In addition, an input TE (known as the test input in the JTAG standard) of each cell receives a same and unique test activation signal TEST_MODE. This signal enables the control of a multiplexer which selects the inputs D or TI whose logic value is loaded into the flip-flop when an edge of the CLOCK signal appears at input CP. In other words, the CLOCK signal serves to activate the flip-flop in two different ways depending on the TEST_MODE signal.

In the normal mode, the clock signal serves to load the instantaneous value of the outputs S1, . . . , Sp of logic unit 10 respectively in the flip-flops of the test cells CT'1, . . . , CT'p. In the test mode, it also serves to activate the shift register formed by test cells CT'1 to CT'p. In both cases, flip-flops CT'1 to CT'p are activated by the edges of the CLOCK signal applied to their inputs CP.

A particular problem arises with electronic circuits which, for reasons connected with their technology, do not include flip-flops responsive to a signal edge, but only latches responsive to a signal level. A signal level is understood to mean the value of a potential referenced with respect to ground which is associated to a given logic state. Indeed, a device such as described above could not operate with a latch responsive to a signal level instead of a flip-flop responsive to a signal edge. Only the logic value loaded into the first test cell CT'1 would be collected directly at node TDO on condition that the TEST_MODE and CLOCK signals were simultaneously high, whereas the logic values loaded into the other test cells would be lost.

For this reason, test cells of another type are used for this circuit. These test cells each include two latches responsive to a signal level and arranged such that one of them operates as a master latch and the other as a slave latch. However, such cells take up a lot of space on the semiconductor substrate on which the electronic circuit is formed.

SUMMARY OF THE INVENTION

An object of the invention is to provide an approach for collecting output logic values from a logic unit within an electronic circuit which overcomes the above-mentioned drawbacks.

This object is achieved in accordance with the invention using a method for collecting logic values from outputs of a logic unit having n inputs and p outputs included within an electronic circuit. The step of collecting is performed by means of p test cells connected in parallel to the respective p outputs of the logic unit such that the logic values of the outputs of the logic unit are loaded in the test cells in a normal mode, and the p test cells are connected in series with each other so as to form a shift register for propagating logic values of outputs of the logic unit to a collecting node in a test mode.

The method further includes a first phase wherein the logic values of one out of two outputs are propagated in the shift register. In a second phase, the logic values of the other outputs of the logic unit are propagated in the shift register. The logic values of the outputs of the logic unit are reloaded in the test cells between the first and second phase.

The invention also provides a device for implementing the above-defined method. The invention further provides an electronic circuit comprising at least one logic unit and such a device for collecting output logic values from the logic unit. Advantageously, it is possible to design an electronic circuit in which each test cell comprises one single latch responsive to a signal level. In this manner, the area of semiconductor substrate occupied by the electronic circuit is reduced.

BRIEF DESCRIPTION OF THE DRAWINGS

Other characteristics and advantages of the invention shall appear from reading the following description. The latter is purely illustrative and should be read in conjunction with the appended drawings in which:

FIG. 4 is a basic diagram for generating two periodic signals of the same frequency in phase opposition and without overlap;

FIG. 5 is a diagram of a circuit for generating the signals illustrated in FIGS. 3b and 3c; and FIGS. 6a to 6e are timing charts of logic signals involved in the circuit illustrated in FIG. 5.

DETAILED DESCRIPTION OF THE PREFERRED EMBODIMENTS

Figure 1:
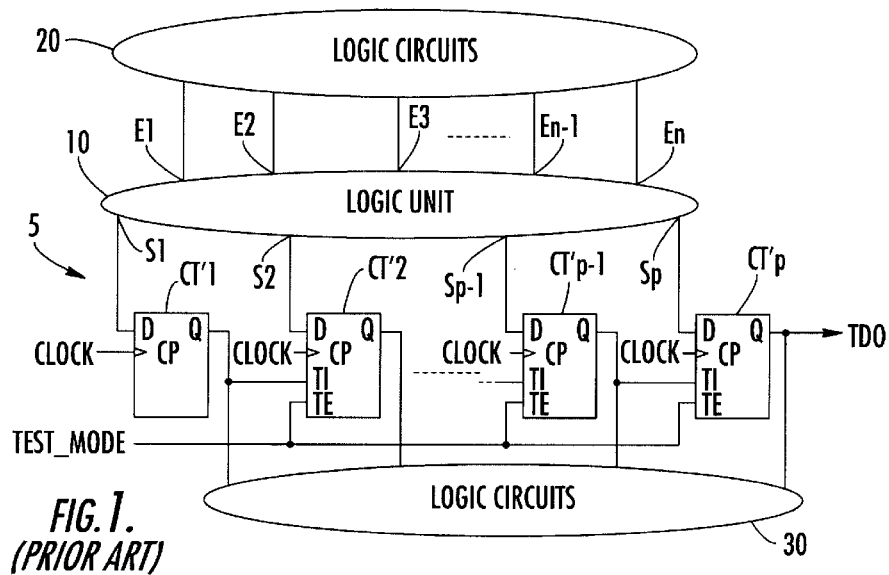
FIG. 1 is a diagram of device for collecting output values from a logic unit according to the prior art.
Figure 2:
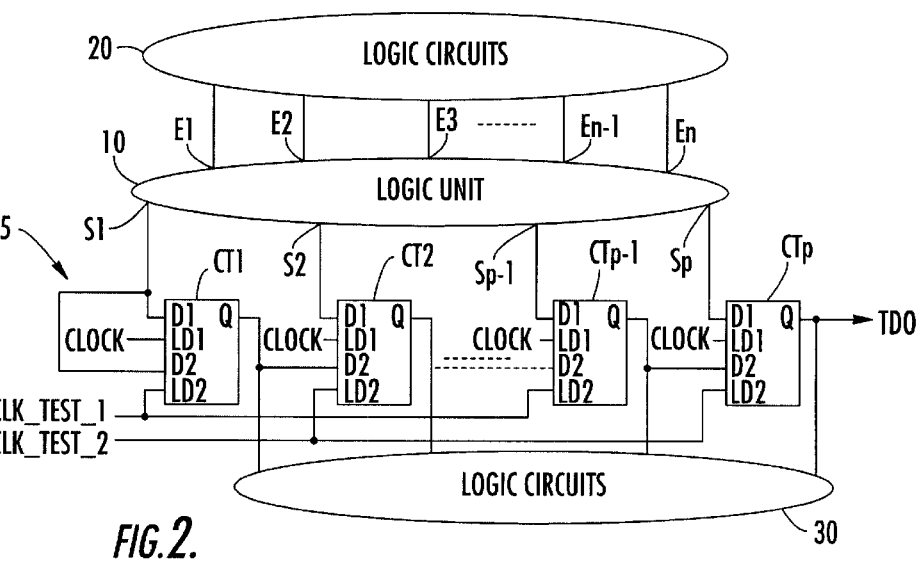
FIG. 2 is a diagram of a device for collecting output values from a logic unit in accordance with the present invention.

FIG. 2, in which the same elements as in FIG. 1 carry the same references, is a diagram of a device for collecting output values from a logic unit in accordance with the invention. In contrast with the test cells CT'1 to CT'p of the device shown in FIG. 1 which included a flip-flop responsive to signal edges, the test cells CT1 to CTp of the device in accordance with the invention each comprise only one latch responsive to a signal level. Cells CT1 to CTN are thus activated by logic signals applied to the command inputs and not by the edges of these signals.

In a preferred embodiment, gates CT1 to CTn are multiplexed latches comprising a first and second data input referenced D1 and D2, as well as a first and second command input referenced LD1 and LD2. The command inputs LD1 and LD2 are respectively associated to the first and second data inputs D1 and D2. In what follows, the multiplexed latches shall be assimilated to the test cells CT1 to CTn. These multiplexed latches are well known by one skilled in the art. They provide both an input selection (or multiplexing) function and a memorization function for the selected input. The operation of such a multiplexed latch is as follows.

When one of the command inputs LD1 or LD2 is activated (i.e., at the high level) and not the other, the Q output passes to the high or low level of the associated data input D1 or D2. This is the selection or multiplexing function. When the command input which was active returns to the low logic state, the Q output remains at the same level until a command input is again activated. This is the memorization function. When none of the command inputs is activated, the Q output remains at the level it was in before. This is the memorization function of the circuit. Note that the case where the two command inputs are simultaneously activated is not used in practice.

In accordance with the invention, the multiplexed latches are connected to the logic unit 10 in the following manner. The first data input D1 of each latch is connected respectively to one of the outputs S1, . . . , Sp of the logic unit 10. The second data input D2 of each latch, except for the first latch CT1, is connected to the output of the preceding latch.

The second data input D2 of the first latch CT1 is connected to its first data input D1 (as shown in FIG. 2), or to anode having a fixed voltage (e.g., the power supply or ground voltage). In a variation, the first latch CT1 does not include a data input D1 nor command inputs LD1 and LD2, which are not necessary for its function. In other words, according to this variation, cell CT1 is a simple D-type latch responsive to a signal level. In addition, the Q output of the last latch CTn is connected to the connecting node TDO. In this way, the test cells CT1 to CTn form a shift register for propagating logic values from the outputs S1, . . . , Sp of the logic unit 10 to node TDO in the test mode.

The device in accordance with the invention comprises means for commanding the test cells to propagate in the shift register the logic values of one out of two outputs of the logic circuit 10 in a first phase, then propagating the logic values of the other outputs of the logic unit 10 in a second phase. The device also includes means for reloading the logic values from outputs S1, . . . , Sp of logic unit 10 into the test cells CT1, . . . , CTn between the first and second phase.

More specifically, the device comprises means for generating a first test clock signal CLK_TEST_1 and a second test clock signal CLK_TEST_2 having the same frequency in phase opposition and being non-overlapping, i.e, not simultaneously in the high state. This thereby avoids the loss of logic values in the shift register. The CLK_TEST_1 signal is applied to the second command inputs LD2 of the shift register's odd-number ranked latches such as CT1, CT3, CT5, . . . , The CLK_TEST_2 signal is applied to the second command inputs LD2 of the shift register's even-number ranked latches such as CT2, CT4, CT6, . . . .

The operation of the device for implementing the method in accordance with the invention is as follows. In a first phase, the logic values of one out of two outputs of the logic unit 10 are propagated in the shift register and then, in a second phase, the logic values of the other outputs of the logic unit 10 are propagated in the shift register. The logic values of the outputs S1, . . . , Sp of the logic unit 10 are reloaded in the test cells between the first and second phase. To this end, the clock signals CLOCK, and CLK_TEST_1 and CLK_TEST_2 applied to command inputs LD1 and LD2 of latches CT1 to CTp exhibit voltage pulses to activate the command inputs as shall be described below. The timing charts of these three signals are shown respectively in FIGS. 3a, 3b and 3c.

Figure 3A:
FIGS. 3a to 3c are timing charts for logic signals controlled by the device illustrated in FIG. 2.

Signal CLOCK shown in FIG. 3a exhibits a first pulse serving to load the logic values of S1 to Sp respectively into latches CT1 to CTn. In practice, this result is already obtained from the moment the circuit has operated in the normal mode. This step is therefore not an essential step for the process in accordance with the invention.

Subsequently, in a first phase of the process in accordance with the invention, the CLK_TEST_1 and CLK_TEST_2 signals alternately exhibit pulses which do not overlap in pairs. In other words, these clock signals have the same frequency, are in phase opposition and are non-overlapping. Moreover, in this first phase, the CLK_TEST_1 signal is in phase advance relative to the CLK_TEST_2 signal. In this way, it is the logic values of outputs S2, S4, S6, . . . previously loaded into the even rank test cells that are propagated in the shift register to the collection node TDO. The CLOCK signal then exhibits a second pulse serving to reload the logic values of the outputs S1 to Sp respectively into latches CT1 to CTn.

Finally, in a second phase of the process in accordance with the invention, the signals CLK_TEST_1 and CLK_TEST_2 once again exhibit alternating, non-overlapping pulses. However, in this second phase, it is the CLK_TEST_2 signal which is in phase advance relative to the CLK_TEST_1 signal. In this way, it is the logic values of outputs S1, S3, S5, . . . previously loaded into the test cells of odd rank that are propagated in the shift register to the collection node TDO.

Note that in the course of the each of the above first and second phases, the cells of even and odd rank behave alternately as master and slave cells. In this way, it is possible to propagate the logic values of outputs from the logic unit 10 to the collection node TDO without loss of data. This result is obtained in two phases.

As will have been understood, these logic values are not collected at the end of the shift register (i.e., at the collection node TDO) in the order of the test cells. Instead, first are collected the logic values that were previously loaded into the even ranked test cells, then those that were loaded into the odd ranked test cells. This is not really a drawback because a test instrument connected to a collection node TDO can process these logic values taking their order of collection into account.

As will have been observed from the foregoing, the means for reloading the output values S1, . . . , Sp of the logic unit 10 into the test cells CT1, . . . , CTn between the first phase and the second phase are relatively straightforward since they include means for activating the first command inputs LD1 of the latches. It is a requirement that the output logic values S1, . . . , Sp are not modified between the first and second phase. This is the case, since in general, the two following conditions are present together so that the state of logic unit 10 is not modified: logic unit 10 is of a combinatory logic function, and the logic values of the inputs E1, . . . , En are not modified between the first and second phase. If, in a particular case, one of the above conditions were not met, it would be necessary to restore the state of the outputs of the logic unit 10 before the start of the second phase.

FIG. 4 is a circuit diagram of a base circuit for generating periodic signals of the same frequency which are in phase opposition and non-overlapping. Such a circuit comprises two NOR type logic gates NOR1 and NOR2. An input I is connected to a first input A of each latch. Input I receives a clock signal CK. In contrast with input A of gate NOR1, input A of gate NOR2 is an inverting input. The output S of gate NOR1 is connected to a second input B of gate NOR2. Conversely, output S of gate NOR2 is connected to a second input B of gate NOR1. Output S of gate NOR1 is connected to an output node OUT1 of the circuit. Output S of gate NOR2 is connected to an output node OUT2 of the circuit.

Nodes OUT1 and OUT2 respectively deliver the clock test signals CLK_1 and CLK_2 which have the same frequency (that of signal TCK) and are in phase opposition and non-overlapping.

Figure 3B:
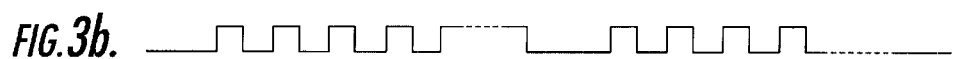
Figure 3C:
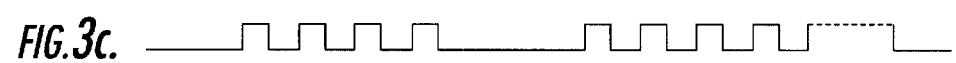

FIG. 5 is a circuit diagram showing a circuit for generating the signals of FIGS. 3b and 3c, which is included within the device in accordance with the invention. The circuit of FIG. 5 constitutes an adaptation of the base circuit shown in FIG. 4, and the common elements carry the same references. Gates NOR1 and NOR2 fulfil the same function. The input I of the circuit receives a clock signal TCK, which is referred to as the test clock signal in the JTAG standard. It is a clock signal which is generated throughout the test mode.

The outputs OUT1 and OUT2 respectively deliver the test clock signals CLK_TEST_1 and CLK_TEST_2. Compared with the base circuit of FIG. 4, the circuit of FIG. 5 is completed with the following means. First time delay means DEL1 and DEL2 maintain a time margin between the moment when one of the test clock signals CLK_TEST_1 or CLK_TEST_2 passes from the high to low level, and the moment when the other clock signal passes to the high level. The means DEL1 are connected between the output OUT1 and input B of gate NOR2. The means DEL2 are connected between the output OUT2 and input B of gate NOR1. These means preferably comprise one or more logic gates which introduce a time delay between the passage of output OUT1 (respectively OUT2) to the high level and the corresponding passage of input B of gate NOR2 (respectively NOR1) to the high level. The means DEL1 and DEL2 do not introduce a logic level inversion of the signals CLK_TEST1 and CLK_TEST_2 which are sent to the B inputs of gates NOR2 and NOR1 respectively.

Second means select either the first test clock signal CLK_TEST_1 or the second test clock signal CLK_TEST_2 that is in phase advance with respect to the other. These means comprise an exclusive OR gate XOR1 which is connected by a first input A to input I of the circuit and by its output S to the A inputs of gates NOR1 and NOR2. A second input B of gate XOR1 receives a signal CLK_INV whose function is to select which of signals CLK_TEST_1 or CLK_TEST_2 is in phase advance with respect to the other depending on whether it is at a high or low level.

Final means prevent or provoke the generation of CLK_TEST_1 and CLK_TEST_2 signal pulses from the TCK signal pulses. These latter means comprise on one hand a first NAND type logic gate NAND1 connected by a first input A to the output S of gate NOR1 and by its output S to the output OUT1 via a first logic inverter INV1. These latter means comprise on the other hand a second NAND type logic gate NAND2 connected by a first input A to the output S of gate NOR2 and by its output S to the output OUT2 via a second logic inverter INV2.

A second input B of each of gates NAND1 and NAND2 receives a same and unique command signal CLK_EN. Accordingly, depending on the high or low state of command signal CLK_EN, signal pulses CLK_TEST_1 and CLK_TEST_2 respectively are generated or not generated. Naturally, the above described means in a preferred embodiment can be implemented in another way, for example, using AND type logic gates instead of a NAND type logic gate followed by an inverter.

FIGS. 6a to 6e are timing charts respectively for the signals TCK, CLK_INV, CLK_EN, CLK_TEST1 and CLK_TEST_2 in the test mode. As explained, signal TCK is a test clock signal which oscillates continuously between the high and low levels in the test mode. A first and a second pulse of signal CLK_EN determine respectively the first and second phase of the process in accordance with the invention.

Note that signal CLK_INV passes from the high level to the low level between the first and second phases (i.e., when signal CLK_EN is at the low level) so as to invert the phase advance of the CLK_TEST_1 and CLK_TEST_2 signals. Note moreover that the CLK_TEST_1 and CLK_TEST_2 signal steps are narrower than the TCK signal steps owing to the delaying action of time delay means DEL1 and DEL2. Consequently, it is assured that the CLK_TEST_1 and CLK_TEST_2 signals are non overlapping in all circumstances.

The invention also proposes an electronic circuit such as shown in FIG. 2 comprising at least one logic unit, such as unit 10 and a device for collecting logic values of the logic unit outputs such as described above. The invention has been described above in a preferred but non-limiting embodiment. In particular, it is possible to use test cells such as those described with reference to FIG. 1 with an external multiplexer, or any other equivalent means instead of multiplexed latches described with reference to FIG. 2.

That which is claimed is:

1. A method for collecting logic values from outputs of a logic unit having n inputs and p outputs included within an electronic circuit, the method comprising the steps of:
   connecting p test cells in parallel to respective p outputs such that logic values of the p outputs ate loaded in the test cells in a normal mode;
   connecting the p test cells in series with each other to form a shift register for propagating logic values of the p outputs to a collecting node in a test mode;
   propagating in the shift register logic values for one out of two of the p outputs in a first phase;
   propagating in the shift register logic values of the other outputs in a second phase; and
   reloading logic values of the p outputs in the p test cells between the first and second phases.

2. A method according to claim 1, wherein each test cell comprises a single latch responsive to a signal level.

3. A method according to claim 2, wherein the latch is a multiplexed latch including first and second data inputs and first and second command inputs associated therewith.

4. A method according to claim 3, wherein the first data input of each latch is connected to a respective one of the p outputs of the logic unit, and the second data input of each latch other than a first latch is connected to an output of a preceding latch.

5. A method according claim 3 wherein the step of reloading the logic values of the p outputs comprises activating the first command inputs of the latches.

6. A method according to claim 3 further comprising the step of generating a first test clock signal and a second test clock signal having a same frequency and in phase opposition and non-overlapping, the first test clock signal being applied to the second command inputs of odd ranked latches in the shift register, and the second test clock signal being applied to the second command inputs of even ranked latches in the shift register.

7. A method according to claim 6 further comprising the step of maintaining a time margin between a moment when one of the first and second test clock signals passes from a high to a low level, and a moment when the other one of the first and second test clock signals passes to the high level.

8. A method according to claim 7 further comprising the step of selecting whether the first test clock signal or the second clock test signal is in phase advance relative to the other.

9. A method of using a device for collecting logic values from outputs of a logic unit having n inputs and p outputs included within an electronic circuit, the device comprising p test cells connected in parallel to respective p outputs such that logic values of the p outputs are loaded in the test cells in a normal mode, and the p test cells are connected in series with each other to form a shift register for propagating logic values of the p outputs to a collecting node in a test mode, the method comprising the steps of:
   propagating in the shift register logic values for one out of two of the p outputs in a first phase;
   propagating in the shift register logic values of the other outputs in a second phase; and
   reloading logic values of the p outputs in the p test cells between the first and second phases.

10. A method according to claim 9, wherein each test cell comprises a single latch responsive to a signal level.

11. A method according to claim 10, wherein the latch is a multiplexed latch including first and second data inputs and first and second command inputs associated therewith.

12. A method according to claim 11, wherein the first data input of each latch is connected to a respective one of the p outputs of the logic unit, and the second data input of each latch other than a first latch is connected to an output of a preceding latch.

13. A method according claim 11 wherein the step of reloading the logic values of the p outputs comprises activating the first command inputs of the latches.

14. A method according to claim 11 further comprising the step of generating a first test clock signal and a second test clock signal having a same frequency and in phase opposition and non-overlapping, the first test clock signal being applied to the second command inputs of odd ranked latches in the shift register, and the second test clock signal being applied to the second command inputs of even ranked latches in the shift register.

15. A method according to claim 14 further comprising the step of maintaining a time margin between a moment when one of the first and second test clock signals passes from a high to a low level, and a moment when the other one of the first and second test clock signals passes to the high level.

16. A method according to claim 15 further comprising the step of selecting whether the first test clock signal or the second clock test signal is in phase advance relative to the other.

17. A device for collecting logic values from outputs of a logic unit having n inputs and p outputs included within an electronic circuit, the device comprising:
   p test cells connected in parallel to the respective p outputs of the logic unit such that logic values of the p outputs are loaded in the test cells in a normal mode, and the p test cells are connected in series with each other to form a shift register for propagating logic values of the p outputs to a collection node in a test mode, each test cell comprising a single latch responsive to a signal level;
   means for commanding the p test cells to propagate in the shift register logic values for at least one out of two of the p outputs in a first phase, and for commanding the p test cells to propagate in the shift register logic values of the other p outputs in a second phase, the at least one out of two of the p outputs in the first phase are alternating outputs with respect to the p outputs of the logic unit, and the alternating outputs are complementary between the first and second phases; and means for reloading logic values of the p outputs in the p test cells between the first and second phases.

18. A device according to claim 17, wherein said latch is a multiplexed latch including first and second data inputs and first and second command inputs associated therewith.

19. A device according to claim 18, wherein the first data input of each latch is connected to a respective one of the p outputs of the logic unit, and the second data input of each latch other than a first latch is connected to an output of a preceding latch.

20. A device according claim 18 wherein the means for reloading the logic values of the p outputs between the first and second phases activates the first command inputs of the latches.

21. A device according to claim 18 wherein the means for commanding comprises means for generating a first test clock signal and a second test clock signal having a same frequency and in phase opposition and non-overlapping, the first test clock signal being applied to the second command inputs of odd ranked latches in the shift register, and said second test clock signal being applied to the second command inputs of even ranked latches in the shift register.

22. A device according to claim 21 wherein the means for commanding comprises time delay means for maintaining a time margin between a moment when one of the first and second test clock signals passes from a high to a low level, and a moment when the other one of the first and second test clock signals passes to the high level.

23. A device according to claim 22 wherein the means for commanding comprises means for selecting whether the first test clock signal or the second clock test signal is in phase advance relative to the each other.

24. A device for collecting logic values from outputs of a logic unit having n inputs and p outputs included within an electronic circuit, the device comprising:
- p test cells connected in parallel to the respective p outputs of the logic unit such that logic values of the p outputs are loaded in the test cells in a normal mode, and the p test cells being connected in series with each other to form a shift register for propagating logic values of the p outputs to a collection node in a test mode;
- a command circuit for commanding the p test cells to propagate in the shift register logic values for at least one out of two of the p outputs in a first phase, and for commanding the p test cells to propagate in the shift register logic values of the other p outputs in a second phase; and
- a reload circuit for reloading logic values of the p outputs in the p test cells between the first and second phases.

25. A device according to claim 24, wherein each test cell comprises a single latch responsive to a signal level.

26. A device according to claim 25, wherein said latch is a multiplexed latch including a first and second data input and a respective first and second command input associated therewith.

27. A device according to claim 26, wherein the first data input of each latch is connected to a respective one of the p outputs of the logic unit, and the second data input of each latch other than a first latch is connected to an output of a preceding latch.

28. A device according claim 26 wherein said reload circuit activates the first command inputs of the latches.

29. A device according to claim 26 wherein said command circuit comprises a clock circuit for generating a first test clock signal and a second test clock signal having a same frequency and in phase opposition and non-overlapping, the first test clock signal being applied to the second command inputs of odd ranked latches in the shift register, and the second test clock signal being applied to the second command inputs of even ranked latches in the shift register.

30. A device according to claim 29 wherein said command circuit further comprises a time delay circuit for maintaining a time margin between a moment when one of the first and second test clock signals passes from a high to a low level, and a moment when the other one of the first and second test clock signals passes to the high level.

31. A device according to claim 30 wherein said command circuit further comprises a selector circuit for selecting whether the first test clock signal or the second clock test signal is in phase advance relative to the each other.

32. An electronic circuit comprising:
- at least one logic unit having n inputs and p outputs;
- at least one device connected to said at least one logic unit for collecting logic values from outputs of said at least one logic unit, said at least one device comprising
  - p test cells connected in parallel to the respective p outputs of said at least one logic unit such that logic values of the p outputs are loaded in the test cells in a normal mode, and the p test cells being connected in series with each other to form a shift register for propagating logic values of the p outputs to a collection node in a test mode;
  - a command circuit for commanding the p test cells to propagate in the shift register logic values for at least one out of two of the p outputs in a first phase, and for commanding said p test cells to propagate in the shift register logic values of the other p outputs in a second phase, and
  - a reload circuit for reloading logic values of the p outputs in the p test cells between the first and second phases.

33. An electronic device according to claim 32, wherein each test cell comprises a single latch responsive to a signal level.

34. An electronic device according to claim 33, wherein said latch is a multiplexed latch including a first and second data input and a respective first and second command input associated therewith.

35. An electronic device according to claim 34, wherein the first data input of each latch is connected to a respective one of the p outputs of said at least one logic unit, and the second data input of each latch other than a first latch is connected to an output of a preceding latch.

36. An electronic device according claim 34 wherein said reload circuit activates the first command inputs of the latches.

37. An electronic device according to claim 34 wherein said command circuit comprises a clock circuit for generating a first test clock signal and a second test clock signal having a same frequency and in phase opposition and non-overlapping, the first test clock signal being applied to the second command inputs of odd ranked latches in the shift register, and the second test clock signal being applied to the second command inputs of even ranked latches in the shift register.

38. An electronic device according to claim 37 wherein said command circuit further comprises a time delay circuit for maintaining a time margin between a moment when one of the first and second test clock signals passes from a high to a low level, and a moment when the other one of the first and second test clock signals passes to the high level.

39. An electronic device according to claim 38 wherein said command circuit further comprises a selector for selecting whether the first test clock signal or the second clock test signal is in phase advance relative to the each other.

40. A method according to claim 1, wherein the one out of two of the p outputs in the first phase are alternating outputs with respect to the p outputs of the logic unit, and the alternating outputs are complementary between the first and second phases.

41. A method according to claim 9, wherein the one out of two of the p outputs in the first phase are alternating outputs with respect to the p outputs of the logic unit, and the alternating outputs are complementary between the first and second phases.

42. A device according to claim 24, wherein the at least one out of two of the p outputs in the first phase are alternating outputs with respect to the p outputs of the logic unit, and the alternating outputs are complementary between the first and second phases.

43. An electronic device according to claim 32, wherein the at least one out of two of the p outputs in the first phase are alternating outputs with respect to the p outputs of said at least one logic unit, and the alternating outputs are complementary between the first and second phases.

* * * * *